United States Patent [19]

Benz et al.

[11] Patent Number: 5,505,790
[45] Date of Patent: Apr. 9, 1996

[54] METHOD FOR ENHANCING CRITICAL CURRENT OF TRINIOBIUM TIN

[75] Inventors: Mark G. Benz, Burnt Hills; Howard R. Hart, Jr., Schenectady; Melissa L. Murray, Schaghticoke; Robert J. Zabala, Schenectady; Bruce A. Knudsen, Amsterdam; Thomas R. Raber, East Berne, all of N.Y.

[73] Assignee: General Electric Company, Schenectady, N.Y.

[21] Appl. No.: 303,803

[22] Filed: Sep. 9, 1994

[51] Int. Cl.$^6$ .................................................. C22F 1/00
[52] U.S. Cl. ............................ 148/98; 148/528; 505/918; 505/927
[58] Field of Search ..................... 148/98, 528; 505/918, 505/925, 927; 29/599; 428/646, 614, 930

[56] References Cited

U.S. PATENT DOCUMENTS

| | | | |
|---|---|---|---|
| 3,352,008 | 11/1967 | Fairbanks | 505/927 |
| 4,746,581 | 5/1988 | Flukiger | 148/98 |
| 5,290,638 | 3/1994 | Williams et al. | 505/925 |
| 5,299,728 | 4/1994 | King et al. | 505/927 |

FOREIGN PATENT DOCUMENTS 2257437  1/1993  United Kingdom ............ 148/98

OTHER PUBLICATIONS

Article–Bennie ten Haken et al., The Influence of Various Strain Components on the Critical Parameters of Layer Shaped Nb3Sn, BX–4, pp. 1–8 Dec. 1983.
Article–J. W. Ekin, Strain Scaling Law and the Prediction of Uniaxial and Bending Strain Effects in Multifilamentary Superconductors, pp. 187–203 Dec. 1983.

*Primary Examiner*—Scott Kastler
*Attorney, Agent, or Firm*—Noreen C. Johnson; James Magee, Jr.

[57] ABSTRACT

A method is described which increases the critical current of triniobium tin by bonding thermal contraction control layers to the triniobium tin superconducting articles at a process temperature to form a composite, and subsequently cooling the composite to a test temperature.

10 Claims, No Drawings

METHOD FOR ENHANCING CRITICAL CURRENT OF TRINIOBIUM TIN

FIELD OF THE INVENTION

This invention is directed to the enhancement of the critical current of triniobium tin superconductoring articles. In particular, the invention relates to the use of thermal contraction control layers to enhance the critical current in superconducting devices of triniobium tin.

BACKGROUND OF THE INVENTION

The effect of strain on the superconducting properties of triniobium tin ($Nb_3Sn$) has been studied for nearly thirty years. It is well known in the art that compressive strains in triniobium tin protect the brittle material from damage that may be encountered during handling, coiling, or from electromagnetic field forces in an energized magnet.

Compressive strains are usually imparted to the triniobium tin by the materials that encase the superconductor. Such materials include bronze in bronze-processed multifilamentary wire or copper foil in laminated liquid-phase diffusion-processed trinibium tin foil. The compressive strain is caused by the difference in thermal expansion coefficients of the copper or bronze cladding and the triniobium tin superconductor. This difference leads to compression of the triniobium tin when the composite is cooled from the processing temperature.

Most triniobium tin superconductor strain-effect research has been performed at high fields on mono- and multi-filamentary bronze-processed wire, which is formed by solid-phase diffusion process.

For instance, a strain scaling relation has been developed by J. W. Ekin, "Strain Scaling Law and the Prediction of Uniaxial and Bending Strain Effects in Multifilamentary A15 Superconductors," *Multifilamentary A15 Superconductors*, M. Suenaga and A. F. Clark, ed., Plenum Press, New York, 1980, 187–203. Ekin's relation predicts the effect of strain on the critical current, $I_c$, based on the axial strain dependence of the magnetic critical field, $B_{c2}$, for multifilamentary superconductors.

Ekin's paper explains that when uniaxial strain is applied to a multifilamentary triniobium tin conductor, the critical current density, $J_c$, typically increases to a maximum value $J_{cm}$ at some strain and then decreases under further uniaxial tension. This maximum in critical current density arises from compressive prestress which the bronze matrix exerts on the triniobium tin reaction layer because of the difference in thermal contraction between the two materials on cooldown after the reaction heat treatment. It is thought that the maximum occurs where the triniobium tin experiences the smallest magnitude of intrinsic strain.

There is a need to develop a method to enhance the critical current of triniobium tin superconducting articles formed by liquid-phase and solid-phase diffusion processes.

BRIEF DESCRIPTION OF THE INVENTION

This invention fulfills this need by providing a method to increase the critical current of a triniobium tin superconducting article comprising: heat treating the triniobium tin superconducting article with at least one thermal contraction control layer, said thermal contraction control layer being at least about as thick as said triniobium tin superconducting article, at a process temperature to form a composite, said composite comprising the triniobium tin superconducting article and the thermal contraction control layer; and cooling the composite to a test temperature lower than the process temperature, to reduce thermal strains and increase the critical current in the triniobium tin superconducting article.

The term "triniobium tin superconducting article" may include the following: a triniobium tin superconductor, a superconducting foil comprising triniobium tin and niobium; a superconducting tape comprising the preceding foil laminated with a protective coating; a superconducting wire comprising triniobium tin and niobium clad with a protective coating; and other such articles comprising triniobium tin that are found to be superconducting. The triniobium tin superconducting article may be made by methods known to those skilled in the art, such as liquid-phase and solid-phase diffusion processes.

Foil, where the triniobium tin superconductor is formed by a liquid-phase diffusion process, is a suitable article for this invention. Generally, the foil is about one mil (0.001 inch) thick. Herein, the term "triniobium tin foil" means foil comprising triniobium tin and niobium.

In a preferred embodiment of this invention, the above-mentioned foil has a protective coating of copper laminated to the top and bottom surfaces of the foil, thus forming "tape" as the triniobium tin superconducting article. Such tape usually has a thickness of about seven mils (0.007 inches). The triniobium tin foil is about one mil (0.001 inch) thick and the copper laminate on each side is about three mils (0.003 inches) thick.

The term "thermal contraction control layer" means a layer or layers of material bonded to the triniobium tin superconducting article to reduce thermal stresses and increase the critical current of the superconductor. One method of bonding is soldering the thermal contraction control layer to the triniobium tin superconducting article. Appropriate soldering temperatures may be between about 423–1023 K.

Generally, two layers of the thermal contraction control material are applied to the triniobium tin superconducting article, so that the article is sandwiched between the two layers, having a symmetrical configuration. For example, in the case of tape, the thermal contraction control layer is bonded to the top and bottom sides of the tape.

The practice of this invention is not limited to using only two thermal contraction control layers. Multiple layers bonded to each other may be used, as well as a single layer bonded to the triniobium tin superconducting article. When a single layer of the thermal contraction control layer is used, its thickness must be sufficient to reduce thermal strains in the triniobium tin superconducting article to increase the critical current. A single thermal contraction control layer provides an unsymmetric configuration. However, the thermal residual strain for laminated triniobium tin on a single substrate is not significantly different from that on double substrates.

The term "process temperature" herein means the temperature used to heat treat the thermal contraction control layer and the triniobium tin superconducting article so that a composite is formed. For instance, when soldering is used to bond the thermal contraction control layers and the triniobium tin superconducting article to form a composite, the process temperature depends on the composition of the solder process and may be about 456K (183° C.), as an example. Likewise, the term "test temperature" refers to a temperature less than the process temperature where the difference between the process temperature and test temperature is sufficient to impart thermal strains to the triniobium tin superconductor upon cooling from the heat treat temperature. Temperatures between about 4.2–18K and where the triniobium tin is superconducting may be used for the test temperature.

By practicing this invention by using niobium as the thermal contraction control layer bonded to triniobium tin tape, the critical current of triniobium tin superconductor can be increased as much as sixty percent in a transverse field of 5T and at a temperature of 4.2K.

DETAILED DESCRIPTION OF THE INVENTION

In this invention the difference in thermal expansion properties between the thermal contraction control layers and the triniobium tin superconducting articles induces uniform compressive or tensile strains in the superconducting layer. This occurs during cooling from the processing temperature used to heat treat the thermal contraction, control layer and the triniobium tin superconducting article to form a composite. The critical current reaches a maximum in the triniobium tin superconductor article when there is zero strain.

When the triniobium tin superconducting article includes copper as a protective coating, the thermal contraction control layers utilized in this invention are materials having thermal coefficients of expansion about equal to or less than copper. Such thermal contraction control layers include, but are not limited to, niobium, tantalum, tungsten, molybdenum, stainless steel, Hastelloy alloys, Inconel alloys, nickel, titanium, steel, chromium, antimony, palladium, platinum, and mixtures thereof. Other materials, including alloys of the above-mentioned base metals, can be used if the thermal coefficient of expansion is about equal to or less than that of copper.

In cases where the triniobium tin superconducting article includes a protective coating other than copper, such as a bronze matrix, then the thermal contraction control layer has a thermal coefficient of expansion less than or equal to the protective coating. For instance, if the protective coating around the triniobium tin is bronze, then the thermal contraction control layers have a thermal coefficient of expansion less than or equal to that of bronze. Such thermal contraction control layers include, but are not limited to, niobium, tantalum, tungsten, molybdenum, stainless steel, Hastelloy alloys, Inconel alloys, nickel, titanium, steel, chromium, antimony, palladium, platinum, and mixtures thereof. Other materials, including alloys of the above-mentioned base metals, can be used if the thermal coefficient of expansion is about equal to or less than that of bronze.

Additionally, in cases where the triniobium tin superconducting article comprises triniobium tin foil without a protective coating, the thermal contraction control layer has a coefficient of expansion matched as closely to that of triniobium tin as possible so as to impart minimal thermal stress to the superconductor. Ideally, the maximum critical current is obtained when there is zero strain imparted to the triniobium tin superconductor.

In one embodiment of this invention, a triniobium tin superconducting article, such as tape (the tape comprising triniobium tin foil with a copper protective coating), is bonded by soldering between two flat, significantly thicker, thermal contraction control layers. The minimum thickness of each thermal contraction control layer should be between about one to five times the thickness of the triniobium tin superconducting article, depending on the material chosen as the thermal contraction control layer. The maximum thickness may be up to twenty times or more of that of the superconducting article. For example, if the triniobium tin tape is about seven mils (0.007 inches) thick, then each thermal contraction control layer is between about seven to thirty-five mils (0.007–0.035 inches) thick. It is noted that the contribution of the solder to the overall thickness of the above-mentioned composite is negligible.

As a manner of demonstrating, the stacking of the layers for the above-mentioned composite, comprising the triniobium tin tape bonded between two thermal contraction control layers, would be "c-b-a-b-c", where "c" equals the thermal contraction control layer, "b+a" equals the triniobium tin tape where "b" equals the copper layer and "a" equals the inner triniobium tin superconductor.

Thermal contraction control layers are chosen so that the difference in thermal expansion properties of the thermal contraction control layer and the triniobium tin superconducting article induces uniform compressive or tensile strains in the superconducting layer during cooling from the processing temperature to the test temperature. Generally, a thermal contraction control layer of the same material is placed on each side of the triniobium tin superconducting article. This is to prevent the bending that would occur during the cooling of a bi-metal strip.

The following discussion further demonstrates the invention using triniobium tin made by liquid-phase diffusion techniques known to those skilled in the art. For example, 25.4 micrometer (0.001 inch) thick niobium alloy foil (Nb-1 atomic % Zr-2 atomic % O) is dipped in a tin alloy melt (Sn-17 atomic % Cu). The tin-coated niobium alloy foil is then reacted at 1050°C. for about 200 seconds. At this temperature, the tin alloy coating is liquid and tin alloy diffuses through the forming triniobium tin layer to react with the solid niobium alloy core. The process forms a layer of fine-grained, superconducting triniobium tin about 7 micrometers thick on both sides of the remaining niobium foil. Strips of copper foil are then soldered to the reacted foil to form a triniobium tin-copper laminate, i.e. tape. This triniobium tin tape is the triniobium tin article.

Differential thermal contraction is achieved by soldering samples of triniobium tin tape between two plates of eight different materials, and cooling the composite structures from the soldering temperature to the test temperature. In the example, brass, copper, stainless steel, Hastelloy X, Inconel 600, nickel, niobium, and tungsten plates are used.

Residual strains in the triniobium tin result from cooling the composite from the solder solidification temperature 456K (183° C.) to liquid helium temperature, 4.2K. An additional residual strain is induced in the triniobium tin during cooling the triniobium tin foil from the reaction temperature, 1323K (1050° C.), to the soldering temperature. At the reaction temperature, there is a liquid intergranular phase. This second phase provides no resistance to shear deformation before the phase solidifies, and thus no straining occurs in the triniobium tin. The liquid phase, which is approximately 65 atomic percent tin-30 atomic percent niobium-5 atomic percent copper, is assumed to solidify at 1223K (950° C.). The resulting residual thermal strain in the triniobium tin due to cooling from 950° C. to 183° C., is approximately +0.03%. This is based on assuming constant moduli for the triniobium tin and niobium in the temperature range.

In a transverse field of 5 Telsa and at a test temperature of 4.2K, a reduction in the thermally applied axial strain of 0.4% increased the critical current by 60%. An axial tensile bending strain of the same magnitude resulted in a critical current increase of only about 9%.

The following examples further demonstrate the invention by tabulating test results for eight different thermal contraction control layers.

EXAMPLES 1–8

Table 1 gives the data for the calculated strains in triniobium tin-copper foil soldered to various substrates. The metals used for substrates include brass, copper, 304L stainless steel, Hastelloy X, Inconel 600, nickel, niobium, and tungsten. The thermally induced axial strain is represented by $\epsilon_x$. The data show a sixty percent increase in critical current, $I_c$, for a change in thermal strain of $\epsilon_x=-0.39$ to $\epsilon_x=0.0$. This represents a difference in $I_c$ of 235 amperes for triniobium tin foil soldered to brass and triniobium tin foil soldered to niobium.

In Table 1, the composite triniobium tin laminates (the triniobium tin-copper foil soldered to various substrates) were tested for critical current in liquid helium, 4.2K, in a field of 5 Telsa. The temperature and magnetic field strength were not varied. For the thermal strain measurements, the magnetic field was oriented along the z-axis. In all of the experiments, the current flows in the axial direction. Voltage probes were placed on the middle one centimeter of the samples and the critical current was defined by a voltage difference of 0.2 microvolts.

TABLE 1

Properties of Substrate Materials, Calculated Residual Thermal Strains in $Nb_3Sn$, and Critical Current Measurements.

| Example | Substrate Material | Modulus elastcity (GPa)$^a$ | $\epsilon_x$ (%) | $I_c$ 4.2 K., 5 T Amperes | $\Delta L/L_o$ for T = 4.2 K.– 456 K (%) |
|---|---|---|---|---|---|
| 1 | Brass | 105 | −0.393 | 393 | 0.676 |
| 2 | Copper | 112 | −0.312 | 424 | 0.596 |
| 3 | Stainless Steel | 190 | −0.306 | 451 | 0.590 |
| 4 | Hastelloy | 200 | −0.185 | 500 | 0.471 |
| 5 | Inconel | 200 | −0.177 | 511 | 0.463 |
| 6 | Nickel | 207 | −0.169 | 528 | 0.456 |
| 7 | Niobium | 103 | 0.002 | 628 | 0.263 |
| 8 | Tungsten | 407 | 0.116 | 565 | 0.161 |
|   | $Nb_3Sn$ | 165 |   |   | 0.282 |

$\Delta L/L_o$ stands for the change in length ($\Delta L$) over the original length ($L_o$).

What is claimed is:

1. A method to increase the critical current of a triniobium tin superconducting article comprising:

contacting the triniobium tin superconducting article with at least one thermal contraction control layer being about 1 to 20 times as thick as said triniobium tin superconducting article, at a temperature to form a composite comprising the triniobium tin superconducting article and the thermal contraction control layer, where the triniobium tin superconducting article comprises a triniobium tin superconductor foil consisting essentially of triniobium tin and niobium, or a triniobium tin superconductor tape consisting essentially of the triniobium tin superconductor foil between a top layer of copper and a bottom layer of copper, or a triniobium tin superconductor wire surrounded by a bronze matrix; and cooling the composite to a test temperature that is lower than the temperature to form the composite and is superconducting between about 4.2–18K.

2. A method according to claim 1 where the thermal contraction control layer of the composite comprising the triniobium tin superconductor tape and the thermal contraction control layer has a thermal coefficient of expansion less than or equal to copper.

3. A method according to claim 2 where said thermal contraction control layer is selected from the group consisting essentially of niobium, tantalum, tungsten, molybdenum, nickel, stainless steel, Inconel alloys, Hastelloy alloys, titanium, steel, chromium, antimony, palladium, platinum, and mixtures thereof.

4. A method according to claim 1 where the thermal contraction control layer of the composite comprising the triniobium tin superconductor wire and the thermal contraction control layer has a thermal coefficient of expansion less than or equal to the bronze matrix.

5. A method according to claim 8 where said thermal contraction control layer is selected from the group consisting essentially of niobium, tantalum, tungsten, molybdenum, nickel, Inconel alloys, Hastelloy alloys, titanium, steel, chromium, antimony, palladium, platinum, and mixtures thereof.

6. A method according to claim 1 where the thickness of the thermal contraction control layer is about 1 to 5 times as thick as the triniobium tin superconducting article.

7. A method according to claim 1 where the triniobium tin superconducting article is the triniobium tin superconducting tape and is bonded to two thermal contraction control layers where the tape is sandwiched between the thermal contraction control layers.

8. A method according to claim 7 where the triniobium tin superconducting tape is bonded to more than two thermal contraction control layers.

9. A method to increase the critical current of a triniobium tin superconducting tape consisting essentially of a triniobium tin superconducting foil between two layers of copper, comprising:

contacting each copper layer of the triniobium tin superconducting tape with at least one thermal contraction control layer at a temperature between about 423–1023K by soldering to form a composite, where the thermal contraction control layer is about 1 to about 20 times as thick as said triniobium tin superconducting tape, where the thermal contraction control layer has a thermal coefficient of expansion less than or equal to copper, and where the thermal contraction control layer is selected from the group consisting of niobium, tantalum, tungsten, molybdenum, nickel, stainless steel, Inconel alloys, Hastelloy alloys, titanium, steel, chromium, antimony, palladium, platinum, and mixtures thereof;

cooling the composite to a temperature that is superconducting between about 4.2–18K.

10. A method to increase the critical current of a triniobium tin superconducting wire in a bronze matrix comprising:

contacting the triniobium tin superconducting wire in the bronze matrix with a thermal contraction control layer at a temperature to form a composite, said thermal contraction control layer being about 1 to about 20 times as thick as the triniobium tin superconducting wire in the bronze matrix, where the thermal contraction control layer has a thermal coefficient of expansion less than or equal to the bronze matrix, and where the thermal contraction control layer is selected from the group consisting essentially of niobium, tantalum, tungsten, molybdenum, nickel, Inconel alloys, Hastelloy alloys, titanium, steel, chromium, antimony, palladium, platinum, and mixtures thereof; and cooling the composite to a temperature that is superconducting between about 4.2–18K.

* * * * *